United States Patent
Shibata et al.

(10) Patent No.: US 11,744,159 B2
(45) Date of Patent: Aug. 29, 2023

(54) PIEZOELECTRIC LAMINATE, METHOD OF MANUFACTURING PIEZOELECTRIC LAMINATE AND PIEZOELECTRIC ELEMENT

(71) Applicant: SUMITOMO CHEMICAL COMPANY, LIMITED, Tokyo (JP)

(72) Inventors: Kenji Shibata, Ibaraki (JP); Kazutoshi Watanabe, Ibaraki (JP); Fumimasa Horikiri, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 1212 days.

(21) Appl. No.: 16/292,873

(22) Filed: Mar. 5, 2019

(65) Prior Publication Data
US 2019/0288180 A1    Sep. 19, 2019

(30) Foreign Application Priority Data
Mar. 14, 2018   (JP) .................................. 2018-47248

(51) Int. Cl.
*H10N 30/85* (2023.01)
*H10N 30/853* (2023.01)
*C04B 35/495* (2006.01)
*H10N 30/076* (2023.01)
*H10N 30/097* (2023.01)
(Continued)

(52) U.S. Cl.
CPC ....... *H10N 30/8542* (2023.02); *C04B 35/495* (2013.01); *H10N 30/076* (2023.02); *H10N 30/097* (2023.02); *H10N 30/1051* (2023.02); *H10N 30/871* (2023.02); *C04B 2235/768* (2013.01)

(58) Field of Classification Search
None
See application file for complete search history.

(56) References Cited

U.S. PATENT DOCUMENTS

2007/0126313 A1   6/2007   Ueno et al.
2009/0236944 A1   9/2009   Shibata et al.
(Continued)

FOREIGN PATENT DOCUMENTS

EP    3364471 A1    8/2018
JP    2007-184513 A    7/2007
(Continued)

OTHER PUBLICATIONS

Lee, Sun Young, et al., "Effect on Mn substitution on ferroelectric and leakage current characteristics of lead-free K0.5Na0.5)(MnxNb1-x)O3thin films", Current Applied Physics, vol. 11, (2011), S 266-269.
(Continued)

*Primary Examiner* — Erica S Lin
(74) *Attorney, Agent, or Firm* — Pearne & Gordon LLP

(57) ABSTRACT

There is provided a piezoelectric laminate, including: a substrate; and a piezoelectric film formed on the substrate, wherein the piezoelectric film contains an alkali niobium oxide represented by a composition formula of $(K_{1-x}Na_x)NbO_3$ $(0<x<1)$, having a perovskite structure, and contains a metallic element selected from a group consisting of Cu and Mn at a concentration of more than 0.6 at % and 2.0 at % or less.

5 Claims, 3 Drawing Sheets

(51) Int. Cl.
*H10N 30/87* (2023.01)
*H10N 30/00* (2023.01)

(56) References Cited

U.S. PATENT DOCUMENTS

| | | |
|---|---|---|
| 2011/0175488 A1 | 7/2011 | Shibata et al. |
| 2014/0042875 A1* | 2/2014 | Suenaga ............. C01G 33/006 |
| | | 29/25.35 |
| 2014/0265723 A1* | 9/2014 | Aida ................... H01L 41/0805 |
| | | 347/68 |
| 2015/0194592 A1 | 7/2015 | Aida et al. |
| 2016/0172574 A1 | 6/2016 | Ikeuchi |
| 2016/0218271 A1* | 7/2016 | Sakuma ................. H10N 30/20 |
| 2018/0301618 A1* | 10/2018 | Shibata .............. H03H 9/02031 |

FOREIGN PATENT DOCUMENTS

| | | |
|---|---|---|
| JP | 2008-159807 A | 7/2008 |
| JP | 2011-146623 A | 7/2011 |
| JP | 2014-107563 A | 6/2014 |
| JP | 2018019108 A | 2/2018 |

OTHER PUBLICATIONS

Search Report issued in European Application No. 19162226 dated Jul. 17, 2019.

* cited by examiner

PIEZOELECTRIC LAMINATE, METHOD OF MANUFACTURING PIEZOELECTRIC LAMINATE AND PIEZOELECTRIC ELEMENT

BACKGROUND

Technical Field

The present disclosure relates to a piezoelectric laminate, a method of manufacturing a piezoelectric laminate, and a piezoelectric element.

Description of Related Art

A piezoelectric compact is utilized widely for a functional electronic component such as a sensor and an actuator. Lead-based materials, in particular, PZT-based ferroelectrics represented by a composition formula of $Pb(Zr_{1-x}Ti_x)O_3$ are used widely for a material of the piezoelectric compact. Since PZT-based piezoelectric compact contains lead, it is not preferable from a viewpoint of a pollution prevention, and the like. Therefore, potassium sodium niobate (KNN) is suggested as a material of the piezoelectric compact not containing lead (see patent documents 1 and 2, for example). Recently, it is strongly required to improve a performance of the piezoelectric compact configured by the material not containing lead such as KNN.

PRIOR ART DOCUMENT

Patent document 1: Japanese Patent Laid Open Publication No. 2007-184513
Patent document 2: Japanese Patent Laid Open Publication No. 2008-159807

SUMMARY

The present disclosure discloses a piezoelectric film having a high film property, the piezoelectric film being formed using alkali niobium oxide.

According to an aspect of the present disclosure, there is provided a piezoelectric laminate and a related technique thereof, including:
substrate; and
a piezoelectric film formed on the substrate,
wherein the piezoelectric film contains an alkali niobium oxide represented by a composition formula of $(K_{1-x}Na_x)NbO_3$ ($0<x<1$), having a perovskite structure, and
contains a metallic element selected from a group consisting of Cu and Mn at a concentration of more than 0.6 at % and 2.0 at % or less.

According to the present disclosure, the film property of the piezoelectric film formed using alkali niobium oxide can be improved.

DETAILED DESCRIPTION

An Embodiment of the Present Disclosure

An embodiment of the present disclosure will be described hereafter, with reference to drawings.

(1) Constitution of Piezoelectric Laminate

Figure 1:
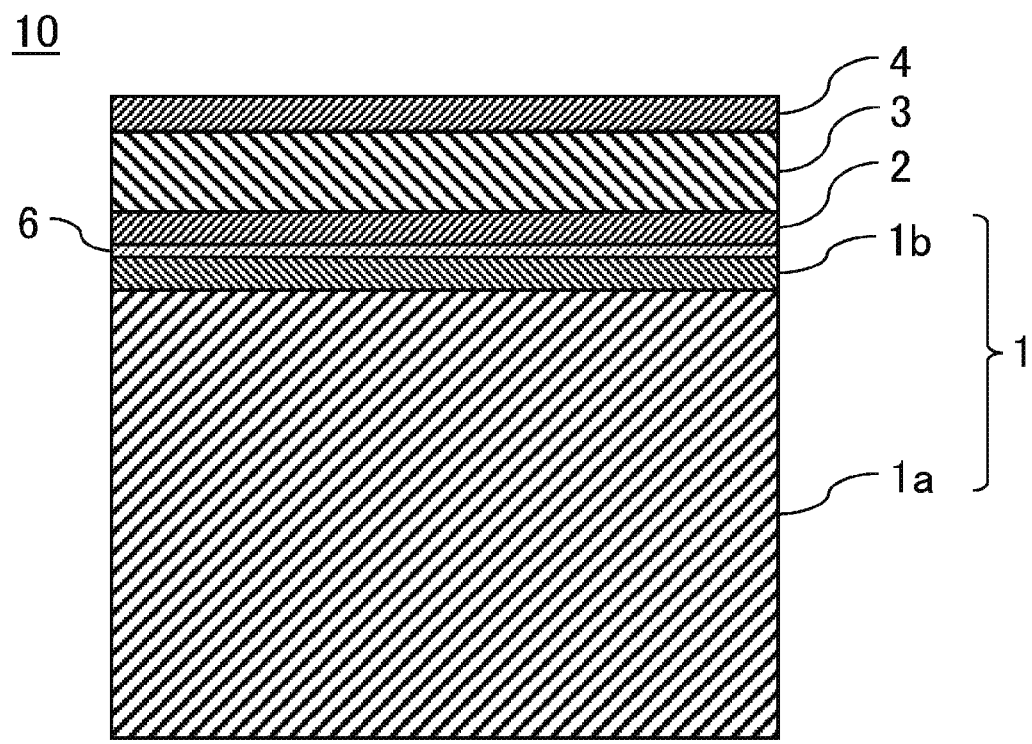
FIG. 1 is a view showing an example of a cross-sectional structure of a piezoelectric laminate according to an embodiment of the present disclosure.

As shown in FIG. 1, a laminate (laminated substrate) 10 having a piezoelectric film (referred to as "piezoelectric laminate 10" hereafter) according to the present embodiment includes a substrate 1, a bottom electrode film (first electrode film) 2 formed on the substrate 1, a piezoelectric film (piezoelectric thin film) 3 formed on the bottom electrode film 2, and a top electrode film (second electrode film) 4 formed on the piezoelectric film 3.

Figure 2:
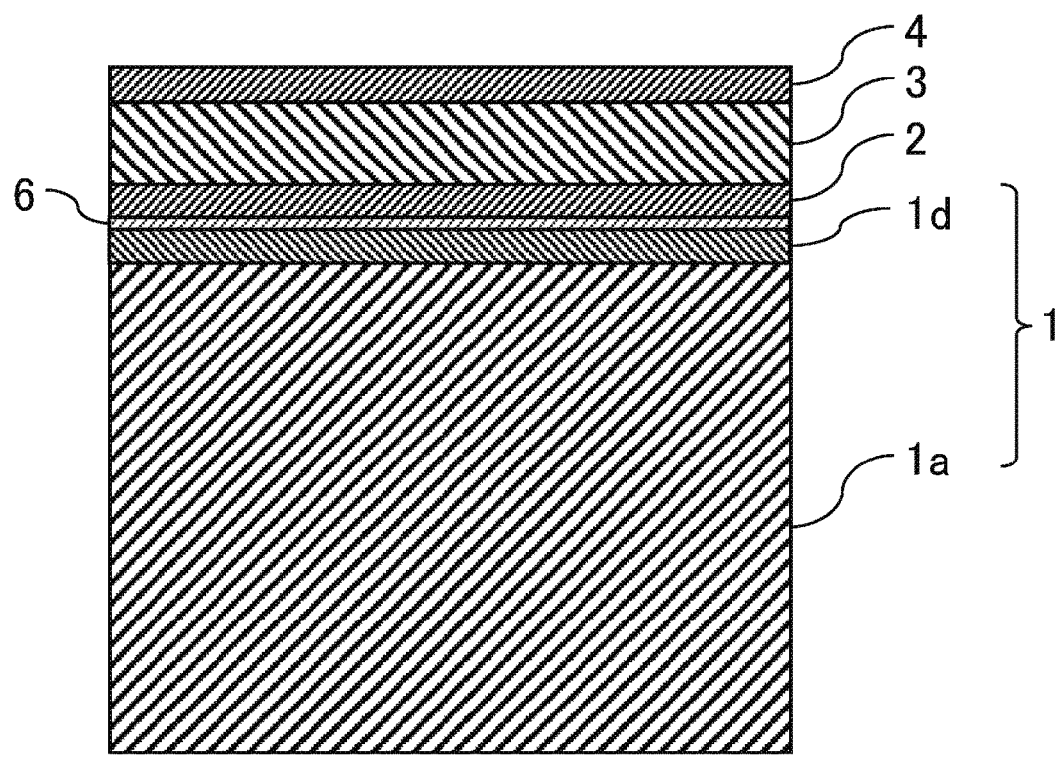
FIG. 2 is a view showing a modified example of a cross-sectional structure of the piezoelectric laminate according to an embodiment of the present disclosure.

As the substrate 1, a single-crystal silicon (Si) substrate 1a on which a surface oxide film ($SiO_2$-film) 1b such as a thermal oxide film or a CVD (Chemical Vapor Deposition) oxide film is formed, namely, a Si-substrate with the surface oxide film, can be used preferably. Further, as shown in FIG. 2, a Si-substrate 1a with an insulating film 1d formed on its surface may also be used as the substrate 1, the insulating film 1d being contained an insulating material other than $SiO_2$. Further, a Si-substrate 1a in which Si-(100) plane or Si-(111) plane, etc., is exposed on a surface thereof, namely, a Si-substrate not having the surface oxide film 1b or the insulating film 1d may also be used as the substrate 1. Further, an SOI (Silicon On Insulator) substrate, a quartz glass ($SiO_2$) substrate, a gallium arsenide (GaAs) substrate, a sapphire ($Al_2O_3$) substrate, a metal substrate formed by a metal material such as stainless steel (SUS) may also be used as the substrate 1. The single-crystal Si-substrate 1a has a thickness of 300 to 1000 μm for example, and the surface oxide film 1b has a thickness of 5 to 3000 nm for example.

The bottom electrode film 2 can be formed using platinum (Pt) for example. The bottom electrode film 2 is a single-crystal film or a poly-crystal film (they are also referred to as Pt-film hereafter). Preferably, crystals constituting the Pt-film are oriented preferentially in (111) plane direction with respect to a surface of the substrate 1. Namely, it is preferable that a surface of the Pt-film (a surface which is a base of the piezoelectric film 3) is mainly constituted of Pt-(111) plane. The Pt-film can be formed using a method such as a sputtering method, or an evaporation method. In addition to Pt, the bottom electrode film 2 may also be formed using various metals such as gold (Au), ruthenium (Ru), or iridium (Ir), an alloy mainly composed of the above various metals, or a metallic oxide such as strontium ruthenate ($SrRuO_3$) or lanthanum nickel oxide ($LaNiO_3$), etc. An adhesion layer 6 mainly composed of titanium (Ti), tantalum (Ta), titanium oxide ($TiO_2$), or nickel (Ni), etc., for example may be provided between the substrate 1 and the bottom electrode film 2 in order to enhance an adhesion between them. The adhesion layer 6 can be formed using a method such as a sputtering method, or an evaporation method. The bottom electrode film 2 has a thickness of 100 to 400 nm for example, and the adhesion layer 6 has a thickness of 1 to 200 nm for example.

The piezoelectric film 3 can be formed using alkali niobium oxide which contains for example, potassium (K), sodium (Na), and niobium (Nb), and which is represented by a composition formula of $(K_{1-x}Na_x)NbO_3$. Namely, the piezoelectric film 3 can be formed using potassium sodium niobate (KNN). An coefficient x [=Na/(K+Na)] in the above composition formula is a value in a range of $0<x<1$, preferably $0.4 \leq x \leq 0.7$. The piezoelectric film 3 is a poly-crystal film of KNN (also referred to as KNN-film 3 hereafter). A crystal structure of KNN is a perovskite structure. Preferably, crystals constituting the KNN-film 3 are oriented preferentially in (001) plane direction with respect to the surface of the substrate 1 (the Si-substrate 1a when the substrate 1 is for example the Si-substrate 1a including the surface oxide film 1b or the insulating film 1d, etc.). Namely, it is preferable that a surface of the KNN-film 3 (a surface which is a base of the top electrode film 4) is mainly constituted of KNN-(001) plane. By forming the KNN-film 3 directly on the Pt-film oriented preferentially in (111) plane direction with respect to the surface of the substrate 1, crystals constituting the KNN-film 3 can be easily oriented preferentially in (001) plane direction with respect to the surface of the substrate 1. For example, 80% or more crystals of a crystal group constituting the KNN-film 3 can be oriented in (001) plane direction with respect to the surface of the substrate 1, and thereby 80% or more region of the surface of the KNN-film 3 can be easily KNN-(001) plane.

The KNN-film 3 contains a metallic element selected from a group consisting of copper (Cu) and manganese (Mn) at a concentration in a range of more than 0.6 at % and 2.0 at % or less, for example. This point will be described later.

The KNN-film 3 can be formed using a method such as a sputtering method, a PLD (Pulsed Laser Deposition) method, or a sol-gel method. When the KNN-film 3 is formed using the sputtering method, a composition ratio of the KNN-film 3 can be adjusted by controlling a composition of a target material used during a sputtering film formation, for example. The target material can be manufactured by mixing and burning $K_2CO_3$-powder, $Na_2CO_3$-powder, $Nb_2O_5$-powder, CuO-powder, or MnO-powder, etc., for example. The composition of the target material can be controlled by adjusting a mixed ratio of $K_2CO_3$-powder, $Na_2CO_3$-powder, $Nb_2O_5$-powder, CuO-powder, and MnO-powder. The KNN-film 3 containing Cu or Mn at the above concentration can be formed by using $(K_{1-x}Na_x)_yNbO_3$ sintered compact containing Cu or Mn at a concentration of more than 0.6 at % and 2.0 at % or less, for example.

Further, the KNN-film 3 may contain an element such as lithium (Li), Ta, antimony (Sb) other than K, Na, Nb, Cu, and Mn in a range of not impairing an effect obtained by adding Cu or Mn in the above range, for example in a range of 5 at % or less.

The top electrode film 4 can be formed using various metals such as Pt, Au, aluminum (Al), or Cu, or an alloy of these various metals, for example. The top electrode film 4 can be formed using a method such as a sputtering method, an evaporation method, a plating method, or a metal paste method. The top electrode film 4 does not greatly affect the crystal structure of the KNN-film 3 unlike the bottom electrode film 2. Therefore, a material and a crystal structure of the top electrode film 4, and a method of forming the top electrode film 4 are not particularly limited. An adhesion layer mainly composed of Ti, Ta, $TiO_2$, Ni, etc., for example may be provided between the KNN-film 3 and the top electrode film 4 in order to enhance an adhesion between them. The top electrode film 4 has a thickness of 100 to 5000 nm for example, and the adhesion layer has a thickness of 1 to 200 nm in a case of providing the adhesion layer.

(2) Constitution of Piezoelectric Device

Figure 3:
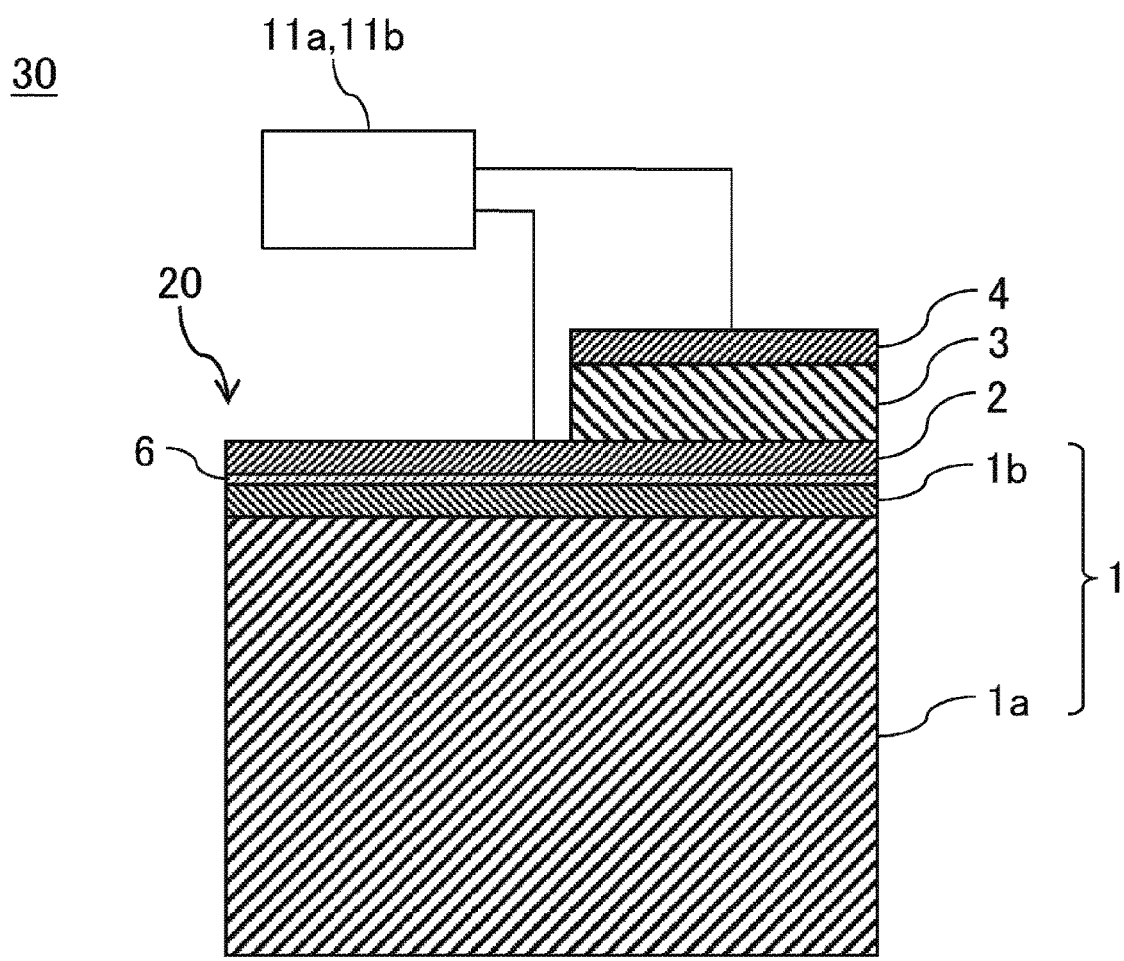
FIG. 3 is a view showing an example of a schematic constitution of a piezoelectric device according to an embodiment of the present disclosure.

FIG. 3 shows a schematic constitution view of a device 30 having the KNN-film 3 of the present embodiment (referred to as "piezoelectric device 30" hereafter). The piezoelectric device 30 includes at least an element 20 (an element 20 having the KNN-film 3, also referred to as "piezoelectric element 20" hereafter) obtained by forming the above piezoelectric laminate 10 into a prescribed shape, and a voltage application unit 11a or a voltage detection unit 11b connected to the piezoelectric element 20.

By connecting the voltage application unit 11a between the bottom electrode film 2 and the top electrode film 4 of the piezoelectric element 20, the piezoelectric device 30 can function as an actuator. By applying a voltage between the bottom electrode film 2 and the top electrode film 4 using the voltage application unit 11a, the KNN-film 3 can be deformed. Various members connected to the piezoelectric device 30 can be actuated due to the above deformation motion. In this case, the piezoelectric device 30 can be applied to a head for an inkjet printer, a MEMS mirror for a scanner, and a vibrator for an ultrasonic generator, etc., for example.

By connecting the voltage detection unit 11b between the bottom electrode film 2 and the top electrode film 4 of the piezoelectric element 20, the piezoelectric device 30 can function as a sensor. When the KNN-film 3 is deformed according to a variation of some physical quantity, a voltage occurs between the bottom electrode film 2 and the top electrode film 4 due to the deformation. By detecting this voltage using the voltage detection unit 11b, the physical quantity applied to the KNN-film 3 can be measured. In this case, the piezoelectric device 30 can be applied to an angular velocity sensor, an ultrasonic sensor, a pressure sensor, and an acceleration sensor, etc., for example.

(3) Method of Manufacturing Piezoelectric Laminate, Piezoelectric Element, and Piezoelectric Device Next, a method of manufacturing the above piezoelectric laminate 10 will be described. First, the bottom electrode film 2 is formed on any one of main surfaces of the substrate 1. It is also acceptable to prepare the substrate 1 on which the bottom electrode film 2 is formed in advance on any one of its main surfaces. Next, the KNN-film 3 is formed on the bottom electrode film 2 using the sputtering method for example. Thereafter, the top electrode film 4 is formed on the KNN-film 3, and therefore the piezoelectric laminate 10 is obtained. Then, the piezoelectric laminate 10 is formed into a prescribed shape by etching, etc., and therefore the piezoelectric element 20 is obtained. Further, the voltage application unit 11a or the voltage detection unit 11b is connected to the piezoelectric element 20, and therefore the piezoelectric device 30 is obtained.

(4) Addition of Cu, Mn into Piezoelectric Film (KNN-Film) 3

As described above, the KNN-film 3 according to the present embodiment contains the metallic element selected from the group consisting of Cu and Mn at the concentration in a range of more than 0.6 at % and 2.0 at % or less. An effect obtained thereby will be described hereafter.

(a) An insulation property (a leakage resistance) of the KNN-film 3 can be improved. For example, a leakage current density can be 250 $\mu A/cm^2$ or less, preferably 200 $\mu A/cm^2$ or less, when an electric field of 250 kV/cm is applied to the KNN-film 3 in a thickness direction.

The insulation property of the KNN-film 3 can be improved by containing Cu or Mn in the KNN-film 3 at the concentration in a prescribed range. Conceivably this is because an oxygen deficiency (oxygen vacancy) exists in the KNN-film 3, due to a volatilization and a deficiency, etc., of element of K, Na, or Nb. This oxygen deficiency moves in the KNN-film 3 when manufacturing or operating the piezoelectric device 30 (piezoelectric element 20). When the oxygen deficiency is moved and reaches the electrode film (the bottom electrode film 2 or the top electrode film 4), the oxygen deficiency reacts with a metal constituting the electrode film, resulting in causing a dielectric breakdown of the KNN-film 3. By containing Cu or Mn in the KNN-film 3 at the concentration in the above range, a movement of the oxygen deficiency can be suppressed. As a result, it can be considered that the insulation property of the KNN-film 3 is improved. Further, by suppressing the movement of the oxygen deficiency, a lifetime of the KNN-film 3 is further extended.

Further, by improving the insulation property of the KNN-film 3, it is possible to enhance a performance of the piezoelectric device 30 such as the sensor or the actuator manufactured by processing the piezoelectric laminate 10.

(b) A dielectric voltage (dielectric strength) of the KNN-film 3 can be enhanced. Thereby, a piezoelectric constant $d_{31}$ of the KNN-film 3 can be measured by applying a higher electric field to the KNN-film 3 than before. For example, the piezoelectric constant $d_{31}$ of the KNN-film 3 can be measured by applying the electric field of 100 kV/cm in the thickness direction of the KNN-film 3. In the KNN-film 3 according to the present embodiment, an absolute value of the piezoelectric constant $|d_{31}|$ is 90 pm/V or more when being measured by applying the electric field of 100 kV/cm to the KNN-film 3 in the thickness direction. On the other hand, in a conventional KNN-film not containing Cu or Mn, or a conventional KNN-film with a low concentration of Cu or Mn, the dielectric breakdown sometimes occurs when applying the above high electric field, because the dielectric voltage is insufficient. Therefore, in the conventional KNN-film, only the electric field of 30 kV/cm can be applied to the KNN-film, when the piezoelectric constant $d_{31}$ is measured. In the KNN-film 3 according to the present embodiment, the piezoelectric constant $d_{31}$ can be measured by applying the electric field of equal to or more than three times higher than before, and the piezoelectric constant $d_{31}$ can be measured under stricter conditions than before. Therefore, a reliability of the piezoelectric device 30 can be improved (a degree of reliability can be enhanced).

Further, by enhancing the dielectric voltage of the KNN-film 3, a drive voltage of the above piezoelectric device 30 can be enhanced. As a result, the piezoelectric device 30 can be applied to a wide range of application.

(c) It is possible to make a relative permittivity of the KNN-film 3 suitable for applying to the actuator, or the sensor, etc. By setting the concentration of Cu or Mn in the KNN-film 3, and by adjusting a parameter such as a film-formation temperature of the KNN-film 3, the relative permittivity of the KNN-film 3 can be 1500 or less, preferably 1000 or more and 1200 or less when being measured under a condition of a frequency of 1 kHz, and ±1 V, for example. For example, the relative permittivity can be low by lowering the film-formation temperature, as long as the concentration of Cu or Mn in the KNN-film 3 is in the above range. After intensive studies by the present inventors, it is found for the first time that the relative permittivity of the KNN-film 3 can be an appropriate value by adjusting the above parameter, as long as the concentration of Cu or Mn in the KNN-film 3 is in the above range.

(d) As described above, by adding Cu or Mn into the KNN-film 3 at the concentration in the above range, a film property of the KNN-film 3 can be improved. The term of "the film property of the KNN-film 3 is improved" used here means at least one of the following effects: the insulation property of the KNN-film 3 is improved, the dielectric voltage is enhanced, or the relative permittivity of the KNN-film 3 is an appropriate value.

In order to simultaneously obtain the above effect in a good balance, it is necessary to set the concentration of Cu or Mn in the KNN-film 3 to more than 0.6 at % and 2.0 at % or less.

When a total concentration of Cu and Mn in the KNN-film 3 is 0.6 at % or less, the effect regarding the insulation property cannot be obtained in some cases, including the effect of suppressing the movement of the oxygen deficiency described above. Further, when the total concentration of Cu and Mn in the KNN-film 3 is 0.6 at % or less, the above effect of enhancing the dielectric voltage of the KNN-film 3 cannot be obtained in some cases. Further, when the total concentration of Cu and Mn in the KNN-film 3 is more than 2.0 at %, it is difficult to obtain an appropriate value of the relative permittivity of the KNN-film 3 even in a case of controlling the parameter such as the film-formation temperature other than the concentration of Cu or Mn in the KNN-film 3. When the relative permittivity of the KNN-film 3 becomes excessive, thereby causing a deterioration of a sensitivity when the KNN-film 3 is applied to the sensor, or causing an increase of a power consumption when it is applied to the actuator, in some cases. One reason can be considered as follows: it is difficult to orient crystals constituting the KNN-film 3 preferentially in (001) plane direction with respect to the surface of the substrate 1, with the increase of an addition amount of Cu or Mn.

Other Embodiment

As described above, explanation has been given specifically for the embodiment of the present disclosure. However, the present disclosure is not limited thereto, and can be variously modified in a range not departing from the gist of the disclosure.

For example, in addition to the metallic element selected from the group consisting of Cu and Mn, or instead of these metallic elements, the KNN-film 3 may contain other metallic element obtained an effect equivalent to Cu or Mn at a concentration in a range of obtaining similar effect as the above embodiment.

For example, the above piezoelectric device 30 may function as a filter device such as a Surface Acoustic Wave (SAW) filter. In this case, the piezoelectric laminate 10 may not include the bottom electrode film 2. Further, in this case, the piezoelectric device 30 (piezoelectric element 20) has a plurality of pattern electrodes obtained by forming the electrode film (top electrode film 4) into a prescribed pattern. Further, in this case, the voltage application unit 11a and the voltage detection unit 11b are respectively connected between the pattern electrodes.

Further, when the above piezoelectric laminate 10 is formed into the piezoelectric element 20, the substrate 1 may be removed from the piezoelectric laminate 10, as long as the piezoelectric device 30 manufactured using the piezoelectric laminate 10 (piezoelectric element 20) can be applied to desired applications such as a sensor, or an actuator.

EXAMPLES

Explanation will be given for an experimental result supporting an effect of the above embodiment hereafter.

A Si-substrate with a surface of (100) plane direction, a thickness of 610 μm, a diameter of 6 inches, and having a thermal oxide film (a thickness of 200 nm) formed on its surface, was prepared as a substrate. Then, a piezoelectric laminate was manufactured by forming a Ti-layer (thickness of 2 nm) as an adhesion layer, a Pt-film (oriented preferentially in (111) plane direction with respect to a surface of the Si-substrate and having a thickness of 200 nm) as a bottom electrode film, and a KNN-film (oriented preferentially in (001) plane direction with respect to the surface of the Si-substrate and having a thickness of 2 µm) as a piezoelectric film in this order on the thermal oxide film of the Si-substrate. A Cu-concentration (CuO-concentration) in the KNN-film was set in a range of 0.6 at % to 2.1 at %. In an evaluation as described later, $(K_{1-x}Na_x)NbO_3$ sintered compact containing Mn at a concentration of 0.6 at % or more and 2.1 at % or less instead of Cu, was used as a sputtering target material for forming a KNN-film into which Mn was added. When the sintered compact was formed, MgO-powder instead of CuO-powder was used in a procedure described later.

The Ti-layer is formed using an RF magnetron sputtering method. Conditions for forming the Ti-layer are as follows.
Film-formation temperature: 300° C.
Discharge power: 1200 W
Charging gas: Ar-gas
Pressure in Ar-gas atmosphere: 0.3 Pa
Film-formation time: 1 minute The Pt-film is formed using an RF magnetron sputtering method. Conditions for forming the Pt-film are as follows.
Film-formation temperature: 300° C.
Discharge power: 1200 W
Charging gas: Ar-gas
Pressure in Ar-gas atmosphere: 0.3 Pa
Film-formation time: 5 minutes The KNN-film is formed using an RF magnetron sputtering method. Conditions for forming the KNN-film are as follows.
Film-formation temperature (temperature shown by a heater of a sputtering apparatus): 550° C., 600° C.
Discharge power: 2200 W
Charging gas: Ar+$O_2$ mixed gas
Pressure in Ar+$O_2$ mixed gas atmosphere: 0.3 Pa
Partial pressure of Ar-gas to $O_2$ gas (Ar-partial pressure/$O_2$-partial pressure (ratio of partial pressure)): 25/1
Film-formation rate: 1 µm/hr $(K_{1-x}Na_x)NbO_3$ sintered compact having a composition of (K+Na)/Nb=0.8 to 1.2 and Na/(K+Na)=0.4 to 0.7, and containing Cu at a concentration of 0.6 at % or more and 2.1 at % or less, was used as a sputtering target material for forming the KNN-film into which Cu was added. The target material was formed as follows: $K_2CO_3$-powder, $Na_2CO_3$-powder, $Nb_2O_5$-powder, and CuO-powder were mixed for 24 hours using a ball mill, the mixture was provisionally burned at 850° C. for 10 hours, then pulverized using again the ball mill, and molded under a pressure of 200 MPa, and thereafter burned at 1080° C. The composition of the target material was controlled by adjusting a mixed ratio of $K_2CO_3$-powder, $Na_2CO_3$-powder, $Nb_2O_5$-powder, and CuO-powder, and measured by EDX (energy dispersive X-ray spectrometry) before performing film formation.

(Evaluation Regarding Insulation Property)

An evaluation of the insulation property was performed as follows: a circular Pt-film with a diameter of 0.5 mm was formed on the KNN-film as a top electrode film so that an electric field could be applied between the bottom electrode film and the top electrode film, and a voltage value was measured up to a leakage current of 250 µA/cm² flowing between these electrode films when applying the electric field between these electrode films. Evaluation results regarding the insulation property of the piezoelectric film are shown in the following table 1.

TABLE 1

| Cu-concentration (at %) | Electric field up to flowing of leakage current of 250 µA/cm² |
|---|---|
| 0.6 | 200 kV/cm |
| 0.65 | Without leakage (250 µA/cm² or less, when applying the electric field of 250 kV/cm) |
| 1.0 | Without leakage (250 µA/cm² or less, when applying the electric field of 300 kV/cm) |
| 2.0 | Without leakage (250 µA/cm² or less, when applying the electric field of 300 kV/cm) |
| 2.1 | Without leakage (250 µA/cm² or less, when applying the electric field of 300 kV/cm) |

As shown in Table 1, it was confirmed that the leakage current of 250 µA/cm² flowed through the KNN-film in which the Cu-concentration is 0.6 at %, by applying the electric field of 200 kV/cm in a film thickness direction.

On the one hand, it was confirmed that in the KNN-film in which the Cu-concentration is more than 0.6 at % (for example, 0.65 at %), the leakage current of 250 µA/cm² is not observed, and the leakage current is 200 µA/cm² at a maximum, even when the electric field of 250 kV/cm is applied in the film thickness direction. Further, it was confirmed that in the KNN-film in which the Cu-concentration is 1.0 at % or more, the leakage current of 250 µA/cm² is not observed, even when the electric field of 300 kV/cm is applied in the film thickness direction.

Namely, it can be confirmed that the insulation property of the KNN-film is higher as the Cu-concentration in the KNN-film is higher. Further, it was confirmed that the above effect regarding the insulation property can be obtained similarly to a case of adding Cu into the KNN-film, even when adding Mn instead of Cu into the KNN-film. In this case, a preferred concentration range of a Mn-concentration is the same as the above Cu-concentration range.

(Evaluation Regarding Relative Permittivity)

A relative permittivity is measured by applying an alternating electric field of 1 kHz and ±1 V to the KNN-film. Evaluation results regarding the relative permittivity of the piezoelectric film are shown in the following table 2.

TABLE 2

| Cu-concentration (at %) | Relative permittivity | Film-formation temperature (° C.) |
|---|---|---|
| 0.65 | 1050 | 550 |
| 1.0 | 1150 | 550 |
| 2.0 | 1300 | 550 |
| 2.1 | 1570 | 550 |
| 0.7 | 1580 | 600 |
| 1.0 | 1750 to 1800 | 600 |

As shown in Table 2, it was confirmed that in the KNN-film in which the Cu-concentration is 2.0 at % or less, the relative permittivity can be 1500 or less by controlling the film-formation temperature for example. Further, it was confirmed that in the KNN-film in which the Cu-concentration is more than 0.6 at % and 1.0 at % or less, the relative permittivity can be 1000 or more and 1200 or less by controlling the film-formation temperature.

On the one hand, it was confirmed that in the KNN-film in which the Cu-concentration is more than 2.0 at % (for example, 2.1 at %), the relative permittivity is more than 1500 even when the film-formation temperature is controlled. Further, it was confirmed that in the KNN-film in which the Cu-concentration is more than 0.6 at % and 2.0 at % or less, the relative permittivity is more than 1500 unless the film-formation temperature is controlled.

Namely, it was confirmed that when the Cu-concentration in the KNN-film is more than 0.6 at % and 2.0 at % or less, the relative permittivity can be a value suitable for an application to an actuator and a sensor by controlling the film-formation temperature. Further, it was confirmed that the above effect regarding the relative permittivity can be obtained similarly to a case of adding Cu into the KNN-film, even when adding Mn instead of Cu into the KNN-film. In this case, the preferred concentration range of the Mn-concentration is the same as the above Cu-concentration range.

<Preferable Aspects of the Present Disclosure>

Preferable aspects of the present disclosure will be supplementarily described hereafter.

(Supplementary Description 1)

According to an aspect of the present disclosure, there is provided a piezoelectric laminate, including:
a substrate; and
a piezoelectric film formed on the substrate,
wherein the piezoelectric film contains an alkali niobium oxide represented by a composition formula of $(K_{1-x}Na_x)NbO_3$ (0<x<1), having a perovskite structure, and
contains a metallic element selected from a group consisting of Cu and Mn at a concentration of more than 0.6 at % and 2.0 at % or less.

(Supplementary Description 2)

Preferably, there is provided the laminate of the supplementary description 1, wherein the piezoelectric film has a leakage current density of 250 μA/cm² or less, preferably 200 μA/cm² or less, when an electric field of 250 kV/cm is applied in a thickness direction.

(Supplementary Description 3)

Preferably, there is provided the laminate of the supplementary description 1 or 2, wherein the piezoelectric film has an absolute value of a piezoelectric constant $|d_{31}|$ of 90 pm/V or more, the piezoelectric constant being measured by applying an electric field of 100 kV/cm to the piezoelectric film in a thickness direction.

(Supplementary Description 4)

Preferably, there is provided the laminate of any one of the supplementary descriptions 1 to 3, wherein the piezoelectric film has a relative permittivity of 1500 or less (preferably 1000 or more and 1200 or less), when being measured under a condition of a frequency of 1 kHz.

(Supplementary Description 5)

Preferably, there is provided the laminate of any one of the supplementary descriptions 1 to 4, wherein an electrode film is formed at least either between the substrate and the piezoelectric film, or on the piezoelectric film.

(Supplementary Description 6)

According to another aspect of the present disclosure, there is provided a method of manufacturing a piezoelectric laminate, including:
forming a piezoelectric film on a substrate, which contains an alkali niobium oxide represented by a composition formula of $(K_{1-x}Na_x)NbO_3$ (0<x<1), having a perovskite structure, and which contains a metallic element selected from a group consisting of Cu and Mn at a concentration of more than 0.6 at % and 2.0 at % or less.

(Supplementary Description 7)

Preferably, there is provided the method of the supplementary description 6, wherein in forming the piezoelectric film, by adjusting (controlling) a film-formation temperature, a film as the piezoelectric film is formed, which has a relative permittivity of 1500 or less (preferably 1000 or more and 1200 or less), when being measured under a condition of a frequency of 1 kHz.

(Supplementary Description 8)

Preferably, there is provided the method of the supplementary description 6 or 7, further including at least either forming an electrode film between the substrate and the piezoelectric film, or forming an electrode film on the piezoelectric film.

(Supplementary Description 9)

According to further another aspect of the present disclosure, there is provided a piezoelectric element or a piezoelectric device, including:
a piezoelectric laminate including a substrate, a first electrode film formed on the substrate, a piezoelectric film formed on the first electrode film, containing an alkali niobium oxide represented by a composition formula of $(K_{1-x}Na_x)NbO_3$ (0<x<1), having a perovskite structure, and containing a metallic element selected from a group consisting of Cu and Mn at a concentration of more than 0.6 at % and 2.0 at % or less, and a second electrode film formed on the piezoelectric film; and
at least either a voltage detection unit or a voltage application unit connected between the first electrode and the second electrode.

(Supplementary Description 10)

According to further another aspect of the present disclosure, there is provided a piezoelectric element or a piezoelectric device, including:
a piezoelectric laminate including a substrate, a piezoelectric film formed on the substrate, containing an alkali niobium oxide represented by a composition formula of $(K_{1-x}Na_x)NbO_3$ (0<x<1), having a perovskite structure, and containing a metallic element selected from a group consisting of Cu and Mn at a concentration of more than 0.6 at % and 2.0 at % or less, and an electrode film (pattern electrode) formed on the piezoelectric film; and
at least either a voltage detection unit or a voltage application unit connected between electrodes of the electrode film (the pattern electrodes).

What is claimed is:

1. A piezoelectric laminate, comprising:
a substrate; and
a piezoelectric film formed on the substrate,
wherein the piezoelectric film contains an alkali niobium oxide represented by a composition formula of $(K_{1-x}Na_x)NbO_3$ (0<x<1), has a perovskite structure, and
contains Cu at a concentration of more than 0.6 at % and 2.0 at % or less,
the piezoelectric film has a leakage current density of 250 μA/cm² or less, when an electric field of 250 kV/cm is applied in a thickness direction, and
the piezoelectric film has a relative permittivity of 1500 or less, when being measured under a condition of a frequency of 1 kHz.

2. The piezoelectric laminate according to claim 1, wherein the piezoelectric film has an absolute value of a piezoelectric constant $|d_{31}|$ of 90 pm/V or more, the piezoelectric constant being measured by applying an electric field of 100 kV/cm to the piezoelectric film in a thickness direction.

3. A method of manufacturing a piezoelectric laminate, comprising:
forming a piezoelectric film on a substrate, the piezoelectric film containing an alkali niobium oxide represented by a composition formula of $(K_{1-x}Na_x)NbO_3$ (0<x<1), and having a perovskite structure, the piezoelectric film containing Cu at a concentration of more than 0.6 at % and 2.0 at % or less, the piezoelectric film having a leakage current density of 250 μA/cm² or less, when an electric field of 250 kV/cm is applied in a thickness direction, and the piezoelectric film having a relative permittivity of 1500 or less, when being measured under a condition of a frequency of 1 kHz.

4. A piezoelectric element, comprising:

a piezoelectric laminate comprising:

a substrate, a first electrode film formed on the substrate, a piezoelectric film formed on the first electrode film, the piezoelectric film containing an alkali niobium oxide represented by a composition formula of $(K_{1-x}Na_x)NbO_3$ $(0<x<1)$, and having a perovskite structure, the piezoelectric film containing Cu at a concentration of more than 0.6 at % and 2.0 at % or less, the piezoelectric film having a leakage current density of 250 μA/cm² or less, when an electric field of 250 kV/cm is applied in a thickness direction, and the piezoelectric film having a relative permittivity of 1500 or less, when being measured under a condition of a frequency of 1 kHz, and a second electrode film formed on the piezoelectric film; and at least either a voltage detection unit or a voltage application unit connected between the first electrode film and the second electrode film.

5. A piezoelectric element, comprising:

a piezoelectric laminate comprising:

a substrate, a piezoelectric film formed on the substrate, the piezoelectric film containing an alkali niobium oxide represented by a composition formula of $(K_{1-x}Na_x)NbO_3$ $(0<x<1)$, and having a perovskite structure, and containing Cu at a concentration of more than 0.6 at % and 2.0 at % or less, the piezoelectric film having a leakage current density of 250 μA/cm² or less, when an electric field of 250 kV/cm is applied in a thickness direction, and the piezoelectric film having a relative permittivity of 1500 or less, when being measured under a condition of a frequency of 1 kHz, and a pattern electrode film formed on the piezoelectric film; and at least either a voltage detection unit or a voltage application unit connected between patterns of the pattern electrode film.

* * * * *